United States Patent [19]

Sakurai

[11] 4,166,148

[45] Aug. 28, 1979

[54] PHOTOMASK BLANKS AND PHOTOMASKS PREPARED THEREFROM

[75] Inventor: Kunio Sakurai, Hino, Japan

[73] Assignee: Konishiroku Photo Industry Co., Ltd., Tokyo, Japan

[21] Appl. No.: 824,447

[22] Filed: Aug. 15, 1977

[30] Foreign Application Priority Data

Aug. 14, 1976 [JP] Japan .................................. 51/97365

[51] Int. Cl.² ............................................. B32B 9/04
[52] U.S. Cl. .................................... 428/332; 96/38.3; 156/656; 156/659; 428/469; 428/539
[58] Field of Search .............. 428/209, 210, 539, 469, 428/332; 156/659, 657, 656; 96/38.3, 36.2

[56] References Cited

U.S. PATENT DOCUMENTS

| | | | |
|---|---|---|---|
| 3,542,612 | 11/1970 | Cashau et al. | 156/656 |
| 3,906,133 | 9/1975 | Flutie | 428/172 |

*Primary Examiner*—George F. Lesmes
*Assistant Examiner*—E. Rollins Buffalow
*Attorney, Agent, or Firm*—Martin A. Farber

[57] ABSTRACT

The photomask blank comprises a transparent substrate, a chromium film directly formed on the substrate and having a thickness of less than 15 mμ, an intermediate layer formed on the chromium film and containing chromium oxide and a metal mask layer made of chromium and formed on the intermediate layer. The intermediate layer comprises a single chromium oxide film or a composite layer of a chromium oxide film and a pure chromium film or a mixture of chromium and chromium oxide. The photomask is prepared by etching the chromium film, the intermediate layer and the mask layer of the photomask blank described above.

5 Claims, 3 Drawing Figures

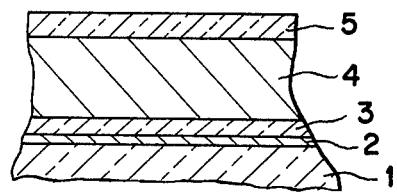
FIG. 1
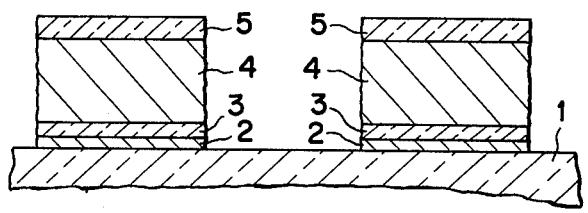
FIG. 2
FIG. 3
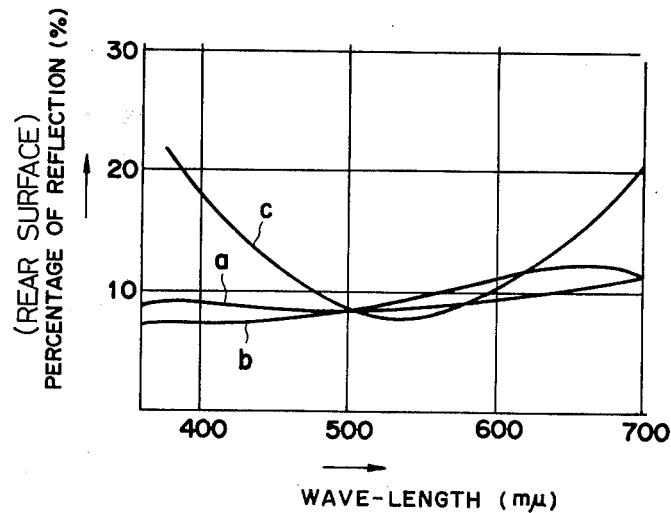

PHOTOMASK BLANKS AND PHOTOMASKS PREPARED THEREFROM

BACKGROUND OF THE INVENTION

This invention relates to a photomask blank and a photomask prepared therefrom which are used in the manufacture of such semiconductor devices as integrated circuits (IC) and large scale integrated circuits (LSI), and more particularly to a chromium photo mask having a low reflection of the rear surface.

Among prior art photomasks there may be mentioned an emulsion mask wherein an emulsion capable of manifesting a high degree of resolution is coated on a transparent substrate made of glass or the like, and a hard mask wherein a film of chromium, chromium oxide, iron oxide etc. are deposited on the transparent substrate by evaporation or sputtering. Due to a recent tendency for increasing circuit elements to be included in the integrated circuit, hard masks are used in most cases.

A chromium mask is a typical use of the hard masks and comprises a transparent substrate and chromium film having a thickness of from 50 to 100 m$\mu$ which is deposited on the substrate by evaporation or sputtering.

The chromium mask has an extremely high reflection (50-60%) so that when printing a mask pattern on a wafer with the use thereof, there is a defect that the resolution of the pattern is decreased due to multiple reflections between the mask and the wafer. For this reason, surface reflection free chromium masks have been developed and used extensively, in which a chromium oxide film having a thickness of 25-35 m$\mu$ is formed on the chromium film.

In the surface reflection free chromium mask, the multiple reflections described above are alleviated or eliminated by the presence of the chromium oxide film so that resolution of the circuit pattern formed can be improved, but the alignment accuracy of the mask is not improved. More particularly, even with such a chromium mask, the reflection of the rear surface (the substrate side surface) of the target pattern that is formed is comparable with the percentage of surface reflection of a conventional wafer with the result that where a certain type of the auto-aligner which utilizes light which is transmitted through the substrate, or a non-contact printer, is used as an aligning device, it is impossible to obtain a sufficient contrast between the target pattern and the wafer.

To solve this problem, that is to decrease the rear surface reflection of the chromium mask, an improved hard mask has been proposed in which a chromium oxide film similar to the surface reflection prevention film and having a thickness of 30 to 40 m$\mu$ is interposed between the substrate and the chromium film. Such hard mask has a construction of a substrate - chromium oxide film - chromium film - chromium oxide film.

We have found that this hard mask incorporated with a rear surface reflection preventing film made of chromium oxide has the following disadvantages.

1. As the amount of side etching (corrosion of the film progressing parallel to the surface of the substrate) at the time of wet etching is large so that it is difficult to form clearly defined sharp edges for the pattern. This is caused by the difference in the solubilities of the chromium film and chromium oxide film in the etching solution. Although it is possible to considerably vary the solubility of the chromium oxide film by controlling the method of preparing the same, the condition of vapor deposition, etc., it is difficult to make the solubility of the chromium oxide film equal to that of the chromium film.

The chromium oxide film, which chromium oxide film is for achieving anti-reflection at the surface which is remote from the substrate, is formed on the chromium mask film, so that it is first dissolved. Accordingly, this chromium oxide film has little effect upon the side etching and the sharpness of the pattern. Where the solubility of the chromium oxide film which is utilized to prevent the rear surface reflection is lower than that of the chromium film, the side etching of the chromium mask film proceeds while the chromium oxide film is being dissolved. On the other hand where the solubility of the chromium oxide film is higher than that of the mask chromium film, the side etching of the chromium oxide film proceeds with the result that the chromium film of the mask becomes irregular, thus degrading the sharpness of the side etching and hence the quality of the resulting photomask.

Considering the problem from the standpoint of the theory of growth of the film by evaporation or sputtering at the initial stage of film forming, since the nuclear density of the chromium oxide film is smaller than that of the chromium film and at the film thickness of about 30 microns, the film structure of the former becomes coarser than that of the latter. These facts also cause blur or an irregular pattern edge and large quantity of side etching.

2. The effect of preventing reflection is not sufficiently large.

Although it is possible to make the reflection sufficiently low near a specific wavelength which is determined by the thickness of the chromium oxide film, it is impossible to make the reflection sufficiently low over the entire range of the visible wavelength. In other words, the light source utilized for auto-alignment is not limited to any type, so that it is desirable that the reflection be sufficiently low for light of any wavelength. However, it is impossible to fulfil such a requirement.

As can be clearly understood from the theory of interference, in order to decrease the reflection on the long wavelength side, it is essential to make the thickness of the chromium oxide film to be approximately 40 to 45 m$\mu$, but with such large film thickness the quantity of the side etching increases.

It is the principal object of this invention to provide an improved photomask blank and a photomask prepared therefrom having a low reflection at the rear surface (the substrate side surface) over substantially the entire range of the visible light, and a small quantity of side etching at the time of photoetching, which can prevent rear surface reflection.

According to this invention there is provided a photomask blank of the type comprising an optically transparent substrate, and a mask layer composed of chromium, characterized in that a film made of chromium, the chromium film having a thickness of less than 15 m$\mu$, and an intermediate layer containing chromium oxide are interposed between the substrate and the mask layer, wherein the chromium film and the intermediate layer are formed in this order from the substrate. The intermediate layer may comprise a single chromium oxide film, or a composite layer including a chromium oxide film and a chromium film or a layer comprising a mixture of chromium oxide and chromium.

The photomask of this invention is prepared by subjecting the mask layer, the chromium film and the intermediate layer of the photomask described above to an etching process.

DESCRIPTION OF THE DRAWING

Further objects and advantages of the invention will become apparent from the following detailed description taken in conjunction with the accompanying drawing in which:

FIG. 1 is an enlarged sectional view of a photomask blank embodying the invention;

FIG. 2 is an enlarged sectional view of a photomask prepared by etching the photomask blank shown in FIG. 1; and FIG. 3 is a graph showing the comparison of the percentage of rear surface reflection of the photomask blank of this invention and that of the prior art photomask blank.

DESCRIPTION OF THE PREFERRED EMBODIMENTS

The photomask blank of this invention shown in FIG. 1 comprises a transparent substrate 1 made of optical glass, for example, with a chromium film 2 deposited on the substrate 1 by vacuum evaporation or sputtering chromium. The thickness of the chromium film is selected to be less than 15 m$\mu$ since with this thickness it is possible to make the reflection at the interface between the substrate 1 and the chromium film to be sufficiently smaller than that (40 to 50%) of a thicker chromium layer, that is to be substantially equal to that (about 4 to 5%) of a glass surface.

The photomask blank further comprises an intermediate layer 3, and the sum of the thicknesses of the chromium film 2 and the intermediate layer 3 is selected to be less than about 40 m$\mu$ by taking into consideration the interference effect of the sum of the film 2 and layer 3. The reason for this lies in that if the sum of the thicknesses of the film 2 and the intermediate layer 3 is larger than this value, the reflection in the visible wavelength range tends to increase due to interference. According to this invention, as the intermediate layer, any one of a chromium oxide film, a composite film comprising a chromium oxide film and a chromium oxide and chromium is used. It is possible to vary as desired the reflection at the rear surface of the substrate 1 by suitably selecting the total number and thickness of the chromium film 2 and the intermediate film 3. In this regard, however, the following facts should be considered. More particularly, when the proportion of the chromium which is contained in the composite layer composed of the chromium layer 2 and the intermediate layer 3 increases, the uniformity of the reflection over the entire range of visible light can be improved but the reflection itself tends to slightly increase. To the contrary as the proportion of the chromium oxide in the composite layer increases, the uniformity of the reflection over the entire range of the visible wavelength becomes poor, but the reflection decreases sufficiently near a specific wavelength which is determined by the total thickness of the chromium film 2 and the intermediate layer 3.

The chromium film 2 and the intermediate layer 3 are formed as follows:

In the vacuum evaporating or sputtering process, the chromium film is deposited on the substrate by using chromium as the source material (evaporation source in the case of vacuum evaporation, and a target in the case of sputtering), whereas the chromium oxide film is deposited by using the chromium oxide or chromium as the source material, each by a reactive method in an oxygen atmosphere. Where chromium oxide is used as the source material, a high quality chromium oxide film can be prepared when the deposition is caused in an atmosphere containing a deficient quantity of oxygen.

These films can be formed in the same or different vacuum tanks. The chromium film and the chromium oxide film can be prepared by an independent vacuum evaporation method and sputtering method.

Where the films are deposited in the same vacuum tank by a reactive process, the source material may consist of chromium above and the switching between the chromium film and the chromium oxide film can be effected by controlling an oxygen admission value. By such a control it is possible to adjust the thickness of a boundary layer in which the degree of oxidation of the chromium varies continuously, whether the composition of the film changes from chromium to chromium oxide or vice versa. The presence of such a boundary layer, however, does not affect the characteristics of the mask of this invention. Where chromium and chromium oxide are used as the source materials for forming a chromium film and chromium oxide film respectively, it is possible to form a composite film comprising a chromium film and a chromium oxide film by alternately opening and closing shutters located above respective sources of evaporation or targets, or to form a film containing a mixture of chromium oxide and chromium by simultaneously depositing them. Instead of forming a mixture film it is possible to form a film consisting of imperfectly oxidized chromium by vapor depositing or sputtering chromium in an atmosphere containing a deficient quantity of oxygen.

Where a quartz crystal oscillator is used to control the thickness of the films which are prepared in the same vacuum tank in a manner well known in the art, it is possible to readily prepare the chromium film and the intermediate film.

In FIG. 1, a mask film 4 having chromium oxide 5 as a film for preventing surface reflection, which comprises a chromium oxide film overlying the surface of the metal mask film 4. Since the thickness and the method of forming these films are well known, it is believed unnecessary to described them in detail.

FIG. 2 shows a photomask prepared by exposing the photomask blank shown in FIG. 1 to light and then etching it with an etching solution. Since the thickness of the intermediate layer 3 acting as a layer for preventing the rear surface reflection is considerably smaller (about ½ to ¾) than that of the chromium oxide film which is utilized to prevent the rear reflection in the prior art photomask, the amount of the side etching caused by the difference in the solubilities of the chromium film and the chromium oxide film to the etching solution can be greatly decreased, thereby sharply defining the pattern edge. The nuclear density of the film at the initial stage of forming it is much higher in the chromium film than in the chromium oxide film. Use of the chromium film 2 in direct contact with the substrate increases the density of the film structure including the intermediate layer 3. This further decreases the amount of side etching and improves the sharpness of the pattern.

In the following, two examples of the photomask blank of this invention are shown:

EXAMPLE 1

|  | material | thickness (mμ) |
|---|---|---|
| chromium film 2 | chromium | 5 |
| intermediate layer 3 | chromium oxide | 15 |
| mask metal layer 4 | chromium | 60 |
| reflection preventing film 5 | chromium oxide | 30 |

EXAMPLE 2

|  | material | thickness (mμ) |
|---|---|---|
| chromium layer 2 | chromium | 3 |
| intermediate layer 3 | chromium oxide | 6 |
|  | chromium | 3 |
|  | chromium oxide | 6 |
|  | chromium | 3 |
|  | chromium oxide | 6 |
| mask metal layer 4 | chromium | 60 |
| reflection preventing film 5 | chromium oxide | 30 |

FIG. 3 is a graph comparing the reflection at the rear surface—wavelength characteristics of the examples 1 and 2 shown by curves a and b and of a prior art photomask blank having a rear surface reflection preventing film comprising only a chromium oxide film shown by curve c. As can be noted from FIG. 3, in the prior art photomask blank although the reflection at a specific wavelength (in this case 530 mμ) is small, the reflection increases greatly on both sides of this wavelength. To the contrary, as shown by curves a and b, in the examples 1 and 2 of the present invention, it is possible to maintain the reflection at a low value over the entire range of the visible wavelength. It is thought that this is attributable to the absorption effect of the chromium in the chromium film 2 and the intermediate layer 3 and the interference effect relating to the thickness of both films 2 and 3.

When the above-exampled photomasks of the present invention were subjected to an etching process using an etching solution which comprises ammonium cerium (IV) nitrate and perchloric acid, degradation of the etched pattern due to the side-etching was not observed.

As above described according to the photomask blank of the present invention which is provided with a chromium film being interposed between a substrate and an intermediate layer containing chromium oxide, it is possible to prevent the rear surface reflection uniformly over the entire range of the visible light and to decrease the amount of side etching, thereby increasing the sharpness of the pattern of the completed photomask.

It should be understood that the invention is not limited to the specific examples described above and that many changes and modifications can be made without departing from the spirit and scope of the invention as defined in the appended claims.

I claim:

1. In a photomask blank of the type comprising an optically transparent substrate, and a metal mask layer formed on the surface of said substrate, the improvement which comprises
    a film formed of chromium directly in contact with said substrate,
    said chromium film having a thickness less than 15 mμ, and
    an intermediate layer containing chromium oxide interposed between said chromium film and said metal mask layer, the sum of the thicknesses of the chromium film and the intermediate layer being less than about 40 mμ, and
    a surface reflection preventing film made of chromium oxide and formed on the surface of said metal mask layer.

2. A photomask blank according to claim 1 wherein said intermediate layer comprises a single chromium oxide film.

3. A photomask blank according to claim 1 wherein said intermediate layer comprises a composite layer comprising a chromium oxide film and a chromium film.

4. A photomask blank according to claim 1 wherein said intermediate layer comprises a mixture of chromium oxide and chromium.

5. A photomask prepared by subjecting the metal mask layer, the chromium film and the intermediate layer of the photomask blank as set forth in claim 1 to an etching process.

* * * * *